(12) United States Patent
St. Clair et al.

(10) Patent No.: US 6,689,288 B2
(45) Date of Patent: Feb. 10, 2004

(54) POLYMERIC BLENDS FOR SENSOR AND ACTUATION DUAL FUNCTIONALITY

(75) Inventors: Terry L. St. Clair, Mechanicsville, VA (US); Joycelyn S. Harrison, Hampton, VA (US); Ji Su, Yorktown, VA (US); Zoubeida Ounaies, Norfolk, VA (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 10/014,158

(22) Filed: Nov. 28, 2001

(65) Prior Publication Data

US 2003/0052576 A1 Mar. 20, 2003

Related U.S. Application Data (60) Provisional application No. 60/250,255, filed on Nov. 28, 2000.

(51) Int. Cl.[7] .............................. H01B 1/12; H01L 41/08
(52) U.S. Cl. ................................ 252/62.9 R; 252/500; 252/501.1; 310/311; 310/330
(58) Field of Search .......................... 252/62.6 R, 500, 252/501.1; 310/311, 330

(56) References Cited

U.S. PATENT DOCUMENTS

| | | |
|---|---|---|
| 4,519,938 A | 5/1985 | Papir |
| 5,687,462 A | 11/1997 | Lazarus et al. |
| 5,729,077 A | 3/1998 | Newnham et al. |
| 5,998,910 A | 12/1999 | Park et al. |
| 6,060,811 A | 5/2000 | Fox et al. |
| 6,182,340 B1 | 2/2001 | Bishop |
| 6,203,727 B1 | 3/2001 | Babinec et al. |
| 6,232,702 B1 | 5/2001 | Newnham et al. |
| 6,239,534 B1 | 5/2001 | Takeuchi et al. |
| 6,515,077 B1 * | 2/2003 | Su et al. ..................... 525/276 |

OTHER PUBLICATIONS

J. Su et al, "Electromechanically Active Polymer Blends for Actuation," Electroactive Polymer Actuators and Devices (EAPAD), SPIE–The International Society of Optical Engineering (Newport Beach, USA), p. 65–72, (Mar. 6, 2000).

* cited by examiner

Primary Examiner—C. Melissa Koslow
(74) Attorney, Agent, or Firm—Robin W. Edwards (57) ABSTRACT

The invention described herein supplies a new class of electroactive polymeric blend materials which offer both sensing and actuation dual functionality. The blend comprises two components, one component having a sensing capability and the other component having an actuating capability. These components should be co-processable and coexisting in a phase separated blend system. Specifically, the materials are blends of a sensing component selected from the group consisting of ferroelectric, piezoelectric, pyroelectric and photoelectric polymers and an actuating component that responds to an electric field in terms of dimensional change. Said actuating component includes, but is not limited to, electrostrictive graft elastomers, dielectric electroactive elastomers, liquid crystal electroactive elastomers and field responsive polymeric gels. The sensor functionality and actuation functionality are designed by tailoring the relative fraction of the two components. The temperature dependence of the piezoelectric response and the mechanical toughness of the dual functional blends are also tailored by the composition adjustment.

21 Claims, 10 Drawing Sheets

POLYMERIC BLENDS FOR SENSOR AND ACTUATION DUAL FUNCTIONALITY

CLAIM OF BENEFIT OF PROVISIONAL APPLICATION

Pursuant to 35 U.S.C. Section 119, the benefit of priority from provisional application No. 60/250,255, with a filing date of Nov. 28, 2000, is claimed for this non-provisional application.

ORIGIN OF THE INVENTION

This invention was jointly made by employees of the United States Government, a contract employee during the performance of work under NASA Contract NAS1-97046, and an employee of the National Research Council and may be manufactured and used by or for the government for governmental purposes without the payment of royalties thereon or therefor. In accordance with 35 USC 202, the contractor elected not to retain title.

BACKGROUND OF THE INVENTION

1. Field of the Invention

This invention relates to electroactive polymeric materials. More particularly, it relates to a new class of polymeric blends for sensor and actuation dual functionality.

2. Description of the Related Art

Sensors and actuators are widely demanded in many technologies to realize precise control of mechanical motion in mechanical, electronic and optical, as well as electro-optical and electromechanical devices. Miniaturization and intellectualization of these devices requires multifunctional materials for simple processing and low cost. Intelligent structures and systems are very important in flight safety and efficiency of aerospace crafts. As a core technology in the intelligent structure and systems, microelectromechanical systems (MEMS) are composed of micro-scale mechanical sensors and actuators. Presently, sensor materials and actuator materials are chosen as separate individual materials for the processing of MEMS.

U.S. Pat. No. 6,239,534 describes a piezoelectric/electrostrictive device. This device, however, requires extensive mechanical manipulation. Specifically, it requires a substrate having two pairs of concave recesses, a connection plate, fixing plate and piezoelectric/electrostrictive elements.

U.S. Pat. No. 6,232,702 describes an electroactive device. This device also has burdensome mechanical requirements. This device requires a ceramic annular substrate having a pair of opposed planar annular surfaces, a hollowed interior region and a thickness aspect.

The new sensor-actuation dual functional polymeric blends described herein provide an enabling electroactive polymer for simplification of processing for MEMS and other electromechanical and electro-optical devices; therefore, the cost of the devices can be significantly reduced.

SUMMARY OF THE INVENTION

It is a primary object of the present invention to provide what is not available in the art, viz., an electroactive polymeric material which provides both sensing and actuation functionality.

It is another object of the present invention to provide a material having temperature invariant piezoelectric response over a range of temperatures.

It is another object of the present invention to provide a material having excellent piezoelectric properties and sensing capability.

It is yet another object of the present invention to provide a material having a large electric field induced strain that significantly increases the range of the electrically-controlled mechanical motion.

Another object of the present invention is to provide a material having excellent processability that makes the material properties tailorable for specific requirements in applications.

Yet another object of the present invention is to provide a lightweight dual-functionality material.

Still another object of the present invention is to provide a material with high power density resulting in reduced energy consumption.

Another object of the present invention is to provide conformable, flexible actuation material that will enable the design for new types of actuators.

Yet another object of the present invention is to provide a two-phase system with adjustable-composition and morphology to optimize mechanical, electrical, and electromechanical properties.

These primary objects, and other attending benefits, are achieved by the present invention. The invention described herein supplies a new class of electroactive polymeric blend materials which offer both sensing and actuation dual functionality. The blend comprises two components, one component having a sensing capability and the other component having an actuating capability. These components should be co-processable and coexisting in a phase separated blend system. Specifically, the materials are blends of a sensing component selected from the group consisting of ferroelectric, piezoelectric, pyroelectric and photoelectric polymers and an actuating component that responds to an electric field in terms of dimensional change. Said actuating component includes, but is not limited to, electrostrictive graft elastomers, dielectric electroactive elastomers, liquid crystal electroactive elastomers and field responsive polymeric gels. The sensor functionality and actuation functionality are designed by tailoring the relative fraction of the two components. The temperature dependence of the piezoelectric response and the mechanical toughness of the dual functional blends are also tailored by the composition adjustment. Since the dual functional blends contain two components, the electric, mechanical, and electromechanical properties of the blends are controlled by the following design parameters: molecular synthesis of sensing polymers and actuating polymers for the blends; selection of the sensing component and actuating components for blends; variation of the fraction of the two component polymers; morphology control of the two components by designed processing routes.

Commercial applications for self-sensing actuation materials include electromechanical transdusors/actuators that can be used in surface flow dynamics control, precise position control, vortex generators in flow control, optical switching, optical filtering, and vibration suppression. These and other actuation applications could benefit from these materials as they will allow simultaneous sensing and actuation capability.

BRIEF DESCRIPTION OF THE DRAWINGS

For a more complete understanding of the present invention, including the primary objects and attending benefits, reference should be made to the Detailed Description of the Invention, which is set forth below. This Detailed Description should be read with reference to the accompanying Drawings, wherein.

DETAILED DESCRIPTION OF THE INVENTION

In a preferred embodiment, the polymer blend combines an electrostrictive graft-elastomer with a piezoelectric poly(vinylidene fluoride-trifluoroethylene) polymer. Mechanical properties, piezoelectric properties and electric field induced strain response of the blends are a function of temperature, frequency and relative composition of the two constituents in the blends. A bending actuator device was developed incorporating the use of the polymer blend materials.

The electrostrictive graft polymer is described fully in U.S. patent application Ser. No. 09/696,528, now U.S. Pat. No. 6,515,077, entitled "Electrostrictive Graft Elastomers" and incorporated by reference herein. The graft-elastomer polymer exhibits a large electric field induced strain due to electrostriction and consists of two components, a flexible backbone elastomer and grafted crystalline groups. The graft crystalline phase provides the polarizable moieties and serves as cross-linking sites for the elastomer system.

Specifically, the electrostrictive graft elastomer comprises a backbone molecule which is a non-crystallizable, flexible macromolecular chain, and a grated polymer forming polar graft moieties with backbone molecules, the polar graft moieties having been rotated by an applied electric field, advantageously into substantial polar alignment. The backbone molecule is advantageously a member selected from the group consisting of silicones, ployurethanes, polysulfides, nitrile rubbers, polybutenes, and flourinated elastomers, e.g., a chlorotrifluoroethylene-vinylidene fluoride copolymer. The grafted polymer is a homopolymer or a copolymer, and the polar graft moieties are polar crystal phases and physical entanglement sites with backbone molecules. The grafted polymer is preferably a member selected from the group consisting of poly(vinylidene fluoride) and poly(vinylidene fluoride-trifluoroethylene) copolymers. In a particularly preferred embodiment, the backbone molecule is a chlorotrifluoroethylene-vinylidene fluoride copolymer, and the grafted polymer is a poly(vinylidene fluoride) or a poly(vinylidene fluoride-trifluoroethylene) copolymer. The polar graft moieties, which are polar crystal phases and physical entanglement sites with backbone molecules, have been rotated by an applied electric field, advantageously into substantial polar alignment.

In the preferred embodiment, the current invention combines this graft-elastomer with a poly(vinylidene fluoride-trifluoroethylene) copolymer to yield a peizoelectric-electrostrictive blend. This blend results in an enhancement of the toughness of the copolymer since the pure copolymer is somewhat brittle after annealing. Likewise it has a higher force output than the pure graft-elastomer when used as an actuator. Additionally, by careful selection of the composition, the potential exists to create a blend system with electromechanical properties that can be tailored for various conditions and applications.

EXAMPLES

Experimental Set-Up

Film Preparation: The blend films were prepared by solution casting. The piezoelectric poly(vinylidene fluoride-trifluoroethylene) copolymer (50/50 mol. %) and graft elastomer powders were added to N,N-dimethylformamide. Although N,N-dimethylformamide was used in this particular example, any solvent capable of dissolving the polymeric functional components for processing may be used. The mixture was heated to 60° C. while stirring to make a 5 wt. % polymer solution containing the desired fraction of the two components. The solution was then cooled to room temperature, cast on glass substrates, and placed in a vacuum chamber. After drying overnight under vacuum, tack-free films were obtained. In order to increase their crystallinity, and possibly their remanent polarization, the blend films were thermally annealed at 140° C. for 10 hours. The thickness of the films was approximately 20 micrometers. The composition and crystallinity of the annealed blend films were determined using an x-ray diffractometer (XRG 3100, Philips) and differential scanning calorimetry.

Poling Treatment: Gold electrodes were sputtered on the opposing surfaces of the films using a plasma deposition set-up (Technics, Inc.) to establish electrical contact. The films were poled using a triangular waveform with a peak value of 100 MV/m at 30 mHz. The blend films were immersed into silicone oil to minimize arcing during the poling treatment.

Mechanical and Piezoelectric Measurements: The modulus, $E_{11}$, and the piezoelectric strain coefficient, $d_{31}$, of the copolymer-elastomer blend films were measured using a modified Rheovibron DDV-II-C (Imass Inc.). The measurements were performed as a function of the relative composition of the blends (wt. % copolymer content), temperature, and frequency.

Electric Field Induced Strain Measurement: The measurement of the electric field induced strain response of the blend films in the longitudinal direction was accomplished using a fiber optic sensor (FOS)-based Dual Channel Angstrom Resolver (OPTO Acoustic Sensors) combined with a waveform generator (Hewlett Packard 33120A), a voltage amplifier (Trek 50/750), and an oscilloscope (Hewlett Packard 54601B). The measurement set-up was computer controlled. The FOS was positioned to measure the out-of-plane displacement through the thickness of the sample. The peak-to-peak displacement was recorded as voltage and converted into meters using the proper gains (filter gain, sensor gain and sensor sensitivity). The frequency of measurement was 1 Hz.

Capacitance Measurement: The capacitance of the blend films was measured using a Hewlett Packard Analyzer 4192A, and the dielectric constant, E, was calculated from the value of the capacitance. These measurements were performed by a function of the relative composition of the blends (wt. % polymer content), temperature, and frequency.

Results

Figure 1:
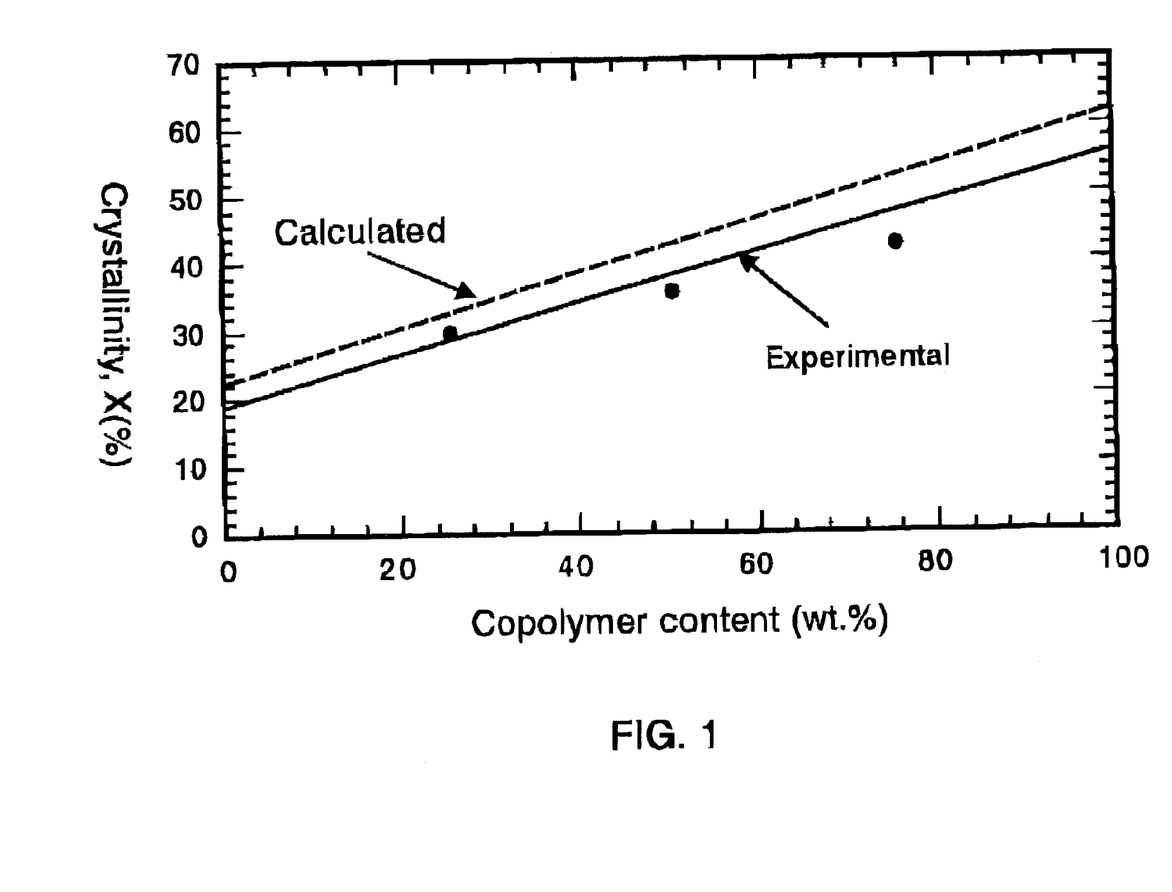
FIG. 1 is a graph showing the relationship between the copolymer content and the crystallinity in the blends.

FIG. 1 shows the crystallinity as a function of copolymer content in the blend. The calculated crystallinity of the blend system is found from:

$$X_{total} = f_{copolymer} X_{copolymer} + f_{elastomer} X_{elastomer} \quad (1)$$

where f is the relative fraction of the components and X is the crystallinity. Both the measured and calculated crystallinities increase with increasing copolymer content in the blend; however, the measured crystallinity is lower than the calculated one. This indicates that the presence of both components in the blend may reduce their crystallization as compared to each individual one.

Figure 2:
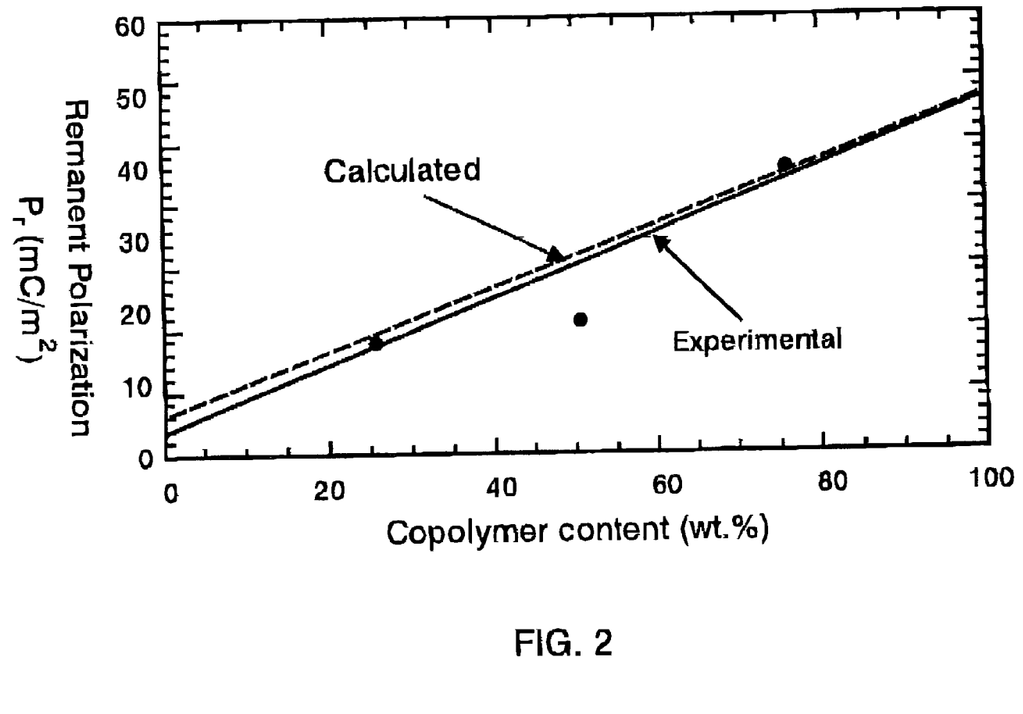
FIG. 2 is a graph showing the relationship between the copolymer content and the remanent polarization.

FIG. 2 shows the measured remanent polarization, $P_r$, as a function of the copolymer content in the blends compared with the remanent polarization calculated using the following equation:

$$P_{r(total)} = f_{copolymer} P_{r(copolymer)} + f_{elastomer} P_{r(elastomer)} \quad (2)$$

where f is the relative fraction of the components, $P_{r(copolymer)}$ is the remanent polarization in the pure copolymer, $P_{r(elastomer)}$ is the remanent polarization in the elastomer, and $P_{r(total)}$ is the resulting remanent polarization of the blend film. To determine the remanent polarization, the measurement of the polarization, P, versus the electric field, E, was carried out. Corrections were made to eliminate the effects of conductivity on the ferroelectric hysteresis loops. Both the measured and the calculated remanent polarization increase with increasing copolymer content in the blends. The value of the measured remanent polarization is very close to the calculated one. This is an indication of the linear relationship between $P_r$ and the polar crystallinity in the blends.

Figure 3:
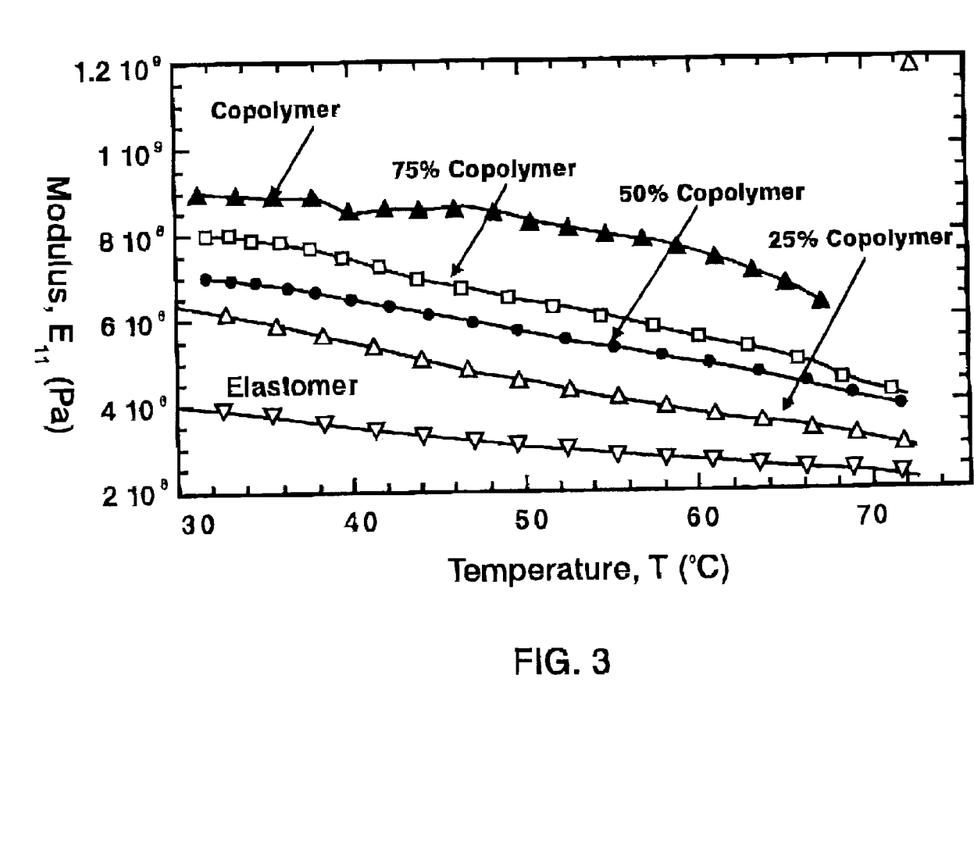
FIG. 3 is a graph comparing the mechanical modulus, $E_{11}$, of the blend films and pure polymer films.

FIG. 3 shows the mechanical modulus, $E_{11}$, for all the blends as a function of temperature at 1 Hz. The mechanical modulus of the blends increases with increasing copolymer content and the copolymer has the highest modulus. Due to the brittleness of the copolymer film, it tended to fail at about 65° C., while the copolymer-elastomer blends show improved toughness compared to the pure copolymer.

Figure 4:
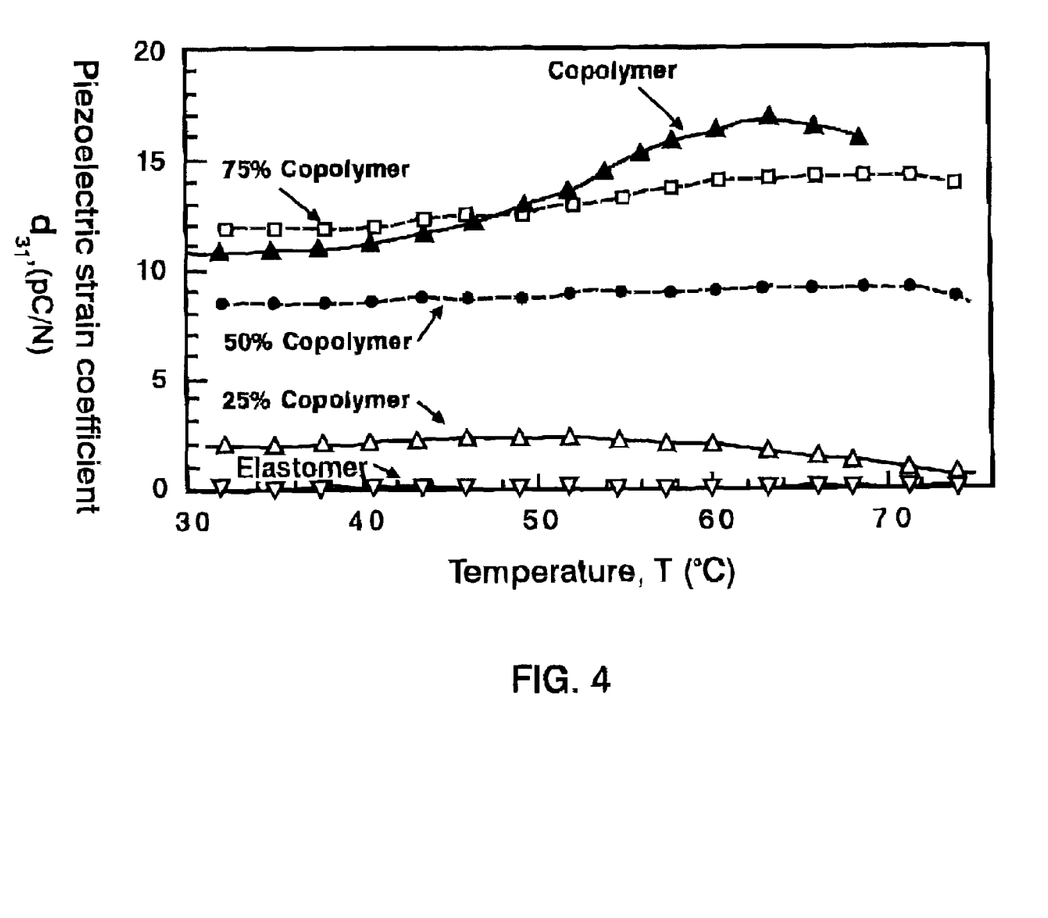
FIG. 4 is a graph showing the temperature dependence of the piezoelectric strain coefficient, $d_{31}$, of the blend films (1 HZ) as a function of various compositions.

FIG. 4 shows the temperature dependence of the piezoelectric strain coefficient, $d_{31}$, for blend films with various compositions. The piezoelectric strain coefficient, $d_{31}$, increases with increasing copolymer content. However, the blend film with 75 wt. % copolymer exhibits the highest $d_{31}$ from room temperature to about 45° C. Additionally, the blend film with 50 wt. % shows an almost constant piezoelectric response from room temperature to 70° C. These results reflect the influence of both the electrical polarization and mechanical modulus of the films on the piezoelectric strain response. As observed in the case of the 75 wt. % copolymer blend, even though it had a lower remanent polarization than the copolymer, it showed a higher piezoelectric strain response due to its lower modulus. For the experimental conditions, the copolymer film breaks at a temperature close to 65° C., while the rest of the blend films maintain their piezoelectric response up to 75° C. without mechanical failure. In particular, the piezoelectric strain response of the 75 wt. % copolymer and 50 wt. % copolymer blend films is still significantly high up to 75° C.

Figure 5:
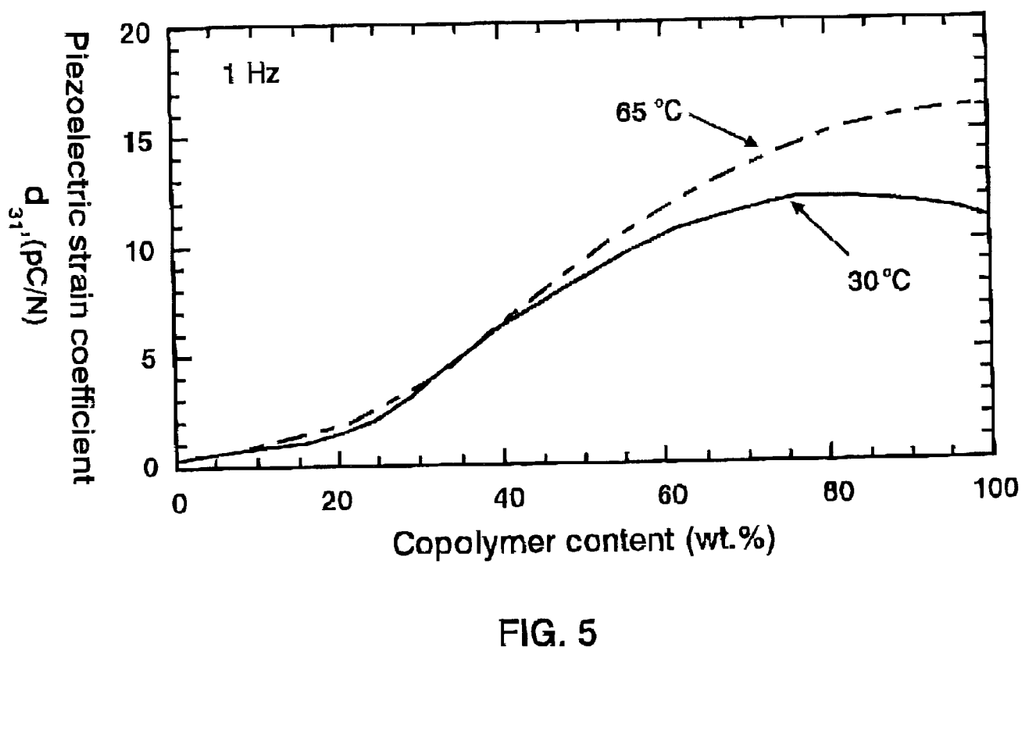
FIG. 5 is a graph showing the relative composition dependence of the piezoelectric strain coefficient, $d_{31}$, at 30° C. and 65° C.

FIG. 5 demonstrates the different trends observed at 30° C. and 65° C. when the dependence of the piezoelectric strain coefficient, $d_{31}$, on the relative composition of the two components in the blend is examined. The reason for the non-linear dependence may be attributed to the nature of the piezoelectric strain response of the material. The intrinsic contributions of both the mechanical properties (through the modulus) and the electrical properties (through the polarization) may yield this non-linear behavior.

Figure 6A:
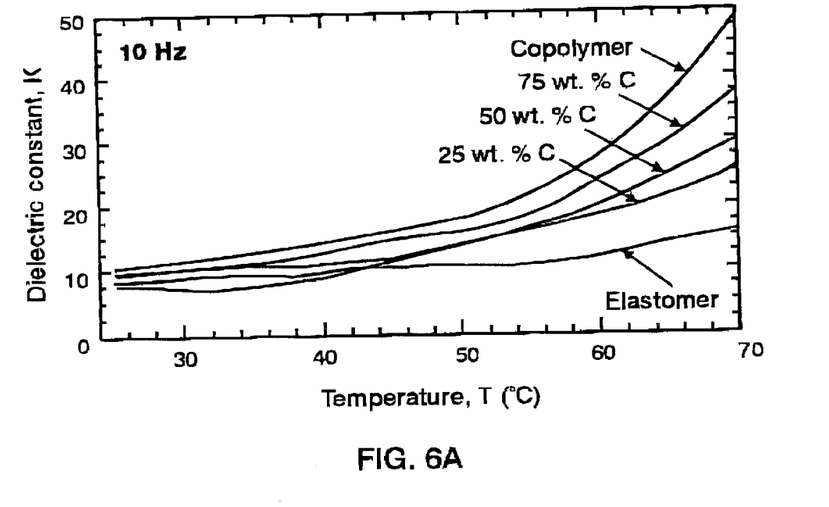
FIG. 6A is a graph showing the temperature dependence of the dielectric constant.
Figure 6B:
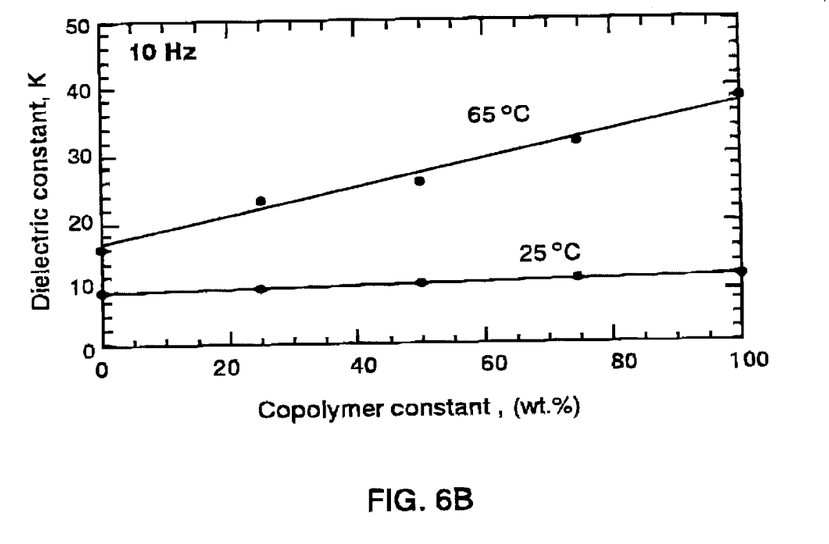
FIG. 6B is a graph showing the composition dependence of the dielectric constant.

FIGS. 6A and 6B show the temperature dependence and composition dependence of the dielectric constant at 10 Hz for the copolymer-elastomer blend films. The temperature dependence of the dielectric constant shown in FIG. 6A gives a reasonable trend for a blend system. The elastomer shows a transitional change in the temperature range from 40° C. to 50° C. and less temperature dependence than the copolymer in the measured temperature range. The transitional change is the second glass transition of the elastomer due to the molecular motion of the graft crystal cross-linking sites. The addition of the copolymer in the blend decreases the second glass transition of the graft elastomer significantly. This might be attributed to the molecular interaction between the added copolymer and graft unit in the elastomer. This interaction may also be the reason that the measured crystallinity of the blend is lower than the calculated one. The dielectric constant of the copolymer shows an obvious increase above 50° C. due to the ferroelectric-paraelectric phase transition. For the blend system, as the copolymer content increases, the transition behavior in the dielectric constant becomes more apparent. FIG. 6B shows the inter-relationship between the dielectric constant and the relative composition of the two components in the blend. Unlike the piezoelectric strain response, the dielectric constant shows a linear dependence to the relative composition at both 25° C. and 65° C.

Figure 7A:
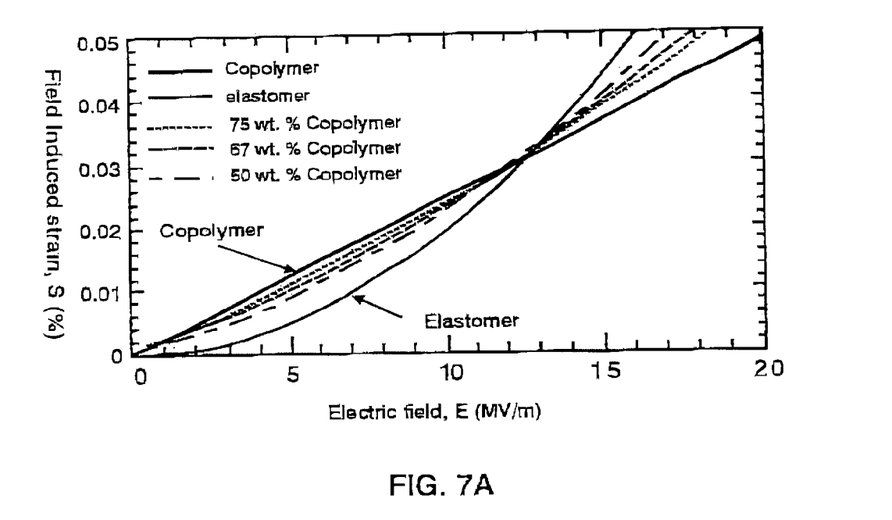
FIG. 7A is a graph showing the field-induced strain response of the blends calculated according to equation (3)
Figure 7B:
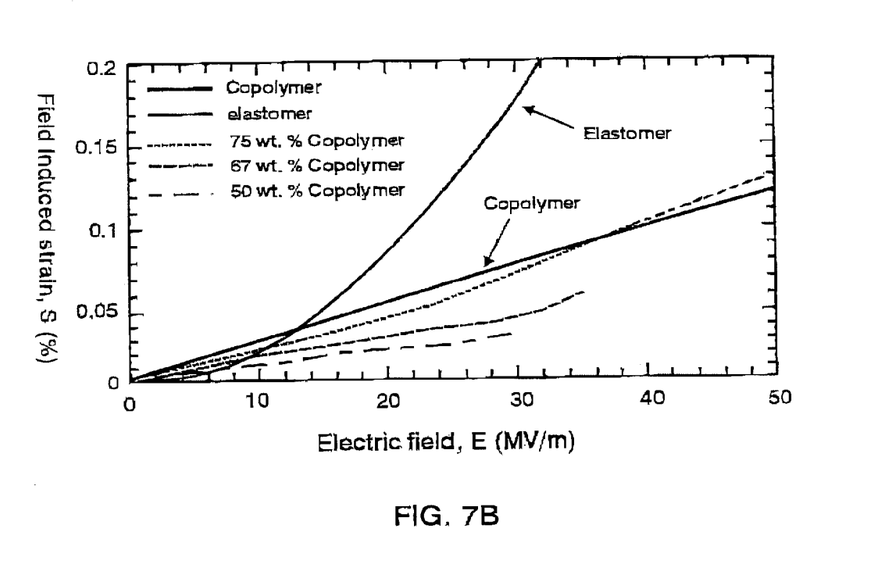
FIG. 7B is a graph showing the measured field-induced strain response of the blends.

FIG. 7A shows the results of a comparison to a field-induced strain response in the copolymer and the graft-elastomer. Assuming the two constituents of the blend system contribute independently to the total field-induced strain response in the blends, the total response in the longitudinal direction can be predicted as $$S = f_{cop.} S_{cop.} + f_{elast.} S_{elast.} = f_{cop.} d_{cop.} E + f_{elast.} R_{elast.} E^2 \quad (3)$$

where S is the total strain, E is the applied electric field, $f_{cop.}$ is the fraction of the piezoelectric copolymer in the blend, $d_{cop.}$ is the piezoelectric coefficient of the piezoelectric copolymer, while $f_{elast.}$ is the fraction of the electrostrictive graft-elastomer, $R_{elast.}$ is the field-induced strain coefficient of the electrostrictive graft-elastomer. Using the piezoelectric coefficient of the copolymer and the field-induced strain coefficient of the graft-elastomer, the field-induced strain for the blends is calculated. The predicted strain response of the copolymer is linear (piezoelectric) while the strain response of the graft-elastomer is quadratic (electrostrictive). As evident in FIG. 7A, the strain response of the blends is intermediate to that of the constituents. There is a critical electric field strength at about 12 MV/m. For field strengths below the critical field, the piezoelectric constituent of the blend is dominant, therefore the strain increases with increasing copolymer content in the blends. Above the critical field strength, the electrostrictive constituent becomes a dominant contributor to the total strain, hence the strain in the blends increases with increasing graft-elastomer content. In FIG. 7B, the experimental results of the field-induced strain of the blend, in the longitudinal direction, is shown as a function of field strength. The blend compositions measured are identical to the blend compositions used in the prediction in FIG. 7A. Although there is a composition dependence for the measured strains, there are several key differences from the predicted strain. First, the measured strain response is significantly smaller than the predicted one. Secondly, the critical field strength for the transition from piezoelectric to electrostrictive dominance occurs at a higher field. Lastly, the electrostrictive (quadratic) contribution becomes evident at a higher field strength in the measured strains. These differences strongly suggest that the electromechanical contributions of the constituents to the total strain response of the blends are not independent. The interactions between the copolymer and graft-elastomer may affect their contributions to the strain response, especially the contribution from the electrostrictive graft-elastomer.

The piezoelectric contribution to the total strain is attributed to the remanent polarization of the crystals within the copolymer, and is expected to be proportional to the relative composition of the copolymer in the blend. The elctrostrictive contribution to the total strain is controlled by the ability of the polar graft moieties in the elastomer to rotate with the applied electric field. Hence the electrostrictive contribution is dependent on the overall morphology of the blend. The effect of the blend morphology on the electrostriction is key since free volume is essential for the rotation of the graft polar moieties in the electrostrictive graft-elastomer. Presence of the copolymer in the blends occupies volume and offers more resistance to the rotation of the polar graft units than in the pure elastomer. This resistance increases the barrier energy for the polar moieties to overcome for their rotation, resulting in the onset of the electrostriction at higher field strengths. This is possibly the key intrinsic mechanism for the differences observed in the experimental and predicted results.

Figure 8:
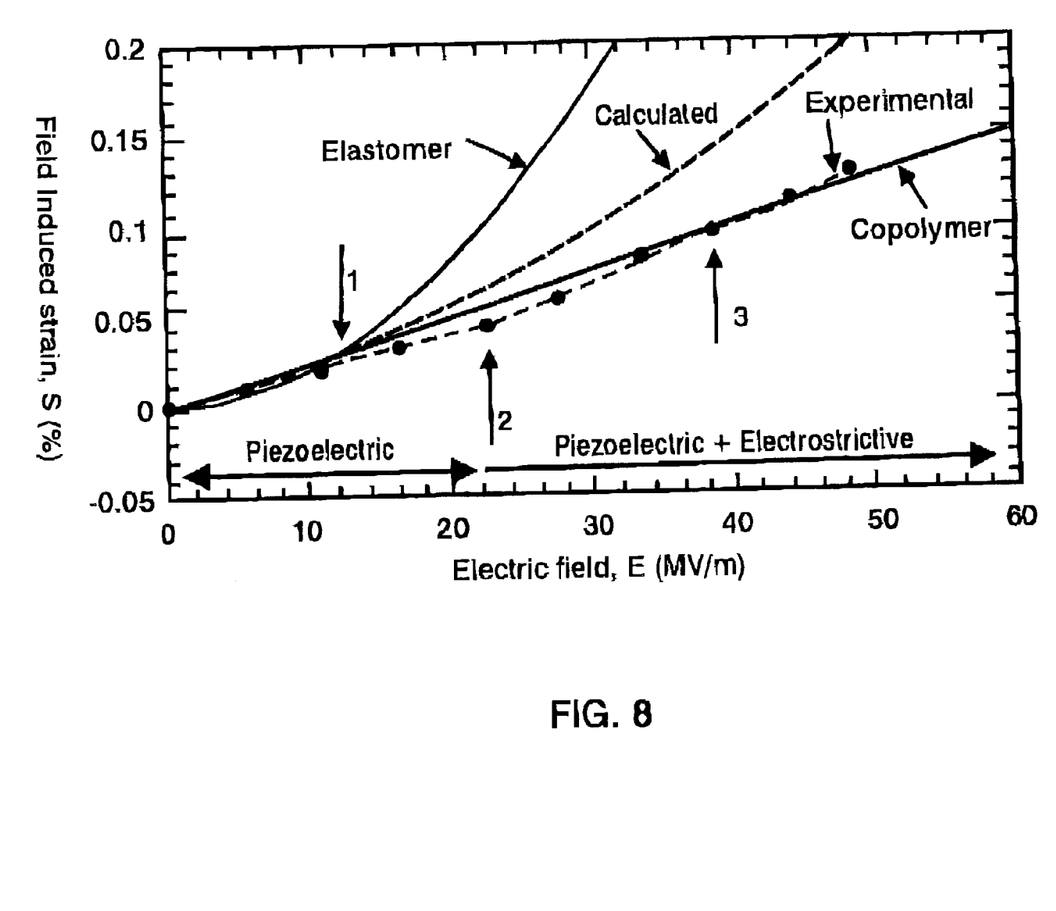
FIG. 8 is a graph comparing the experimental strain response of the 75 wt % copolymer blend with the prediction based on the calculation using equation (3)

In FIG. 8, the measured strain response of 75 wt. % copolymer blend is compared with the prediction calculated using equation (3). According to calculated results, the critical electric field strength is 12 MV/m, (marked as 1). Theoretically, at this critical field strength, the copolymer and the elastomer contribute equally to the overall strain response. However, experimental results indicate that the strain is linear prior to a field strength of about 22 MV/m (marked as 2). As the electric field is increased, the contribution of the electrostrictive elastomer becomes significant as seen by the deviation from linearity above a field strength of 22 MV/m. For field strengths higher than 39 MV/m, the strain of the blend is larger than that of the pure copolymer. This is an indication that the electrostrictive contribution becomes dominant and the field of 39 MV/m (marked 3) is believed to be the critical electric field for the transition from piezoelectric to electrostrictive dominance for the 75 wt. % copolymer blend. This is significantly higher than the calculated one.

According to these observations, the strain response of the blend can be divided into three regions: piezoelectric dominant region, intermediate region, and electrostrictive dominant region. In the piezoelectric dominant region (E<22 MV/m), the contribution of the electrostrictive constituent is not significant since the rotation of the polar component of the elastomer is confined due to the presence of the copolymer constituent, which increases the barrier energy for rotation. In the intermediate region (22 MV/m<E<39 MV/m), the field strength is high enough to overcome the increased barrier energy, therefore, the electrostrictive contribution becomes obvious. In the electrostrictive dominant region (E>39 MV/m), the blend exhibits a field-induced strain higher than that of the copolymer. The increase in the barrier energy for the electrostrictive contribution in the blend should be dependent on the relative copolymer content in the blends, the overall blend morphology, and the crystal size of the constituents as well as the distribution of the crystal size.

Figure 9:
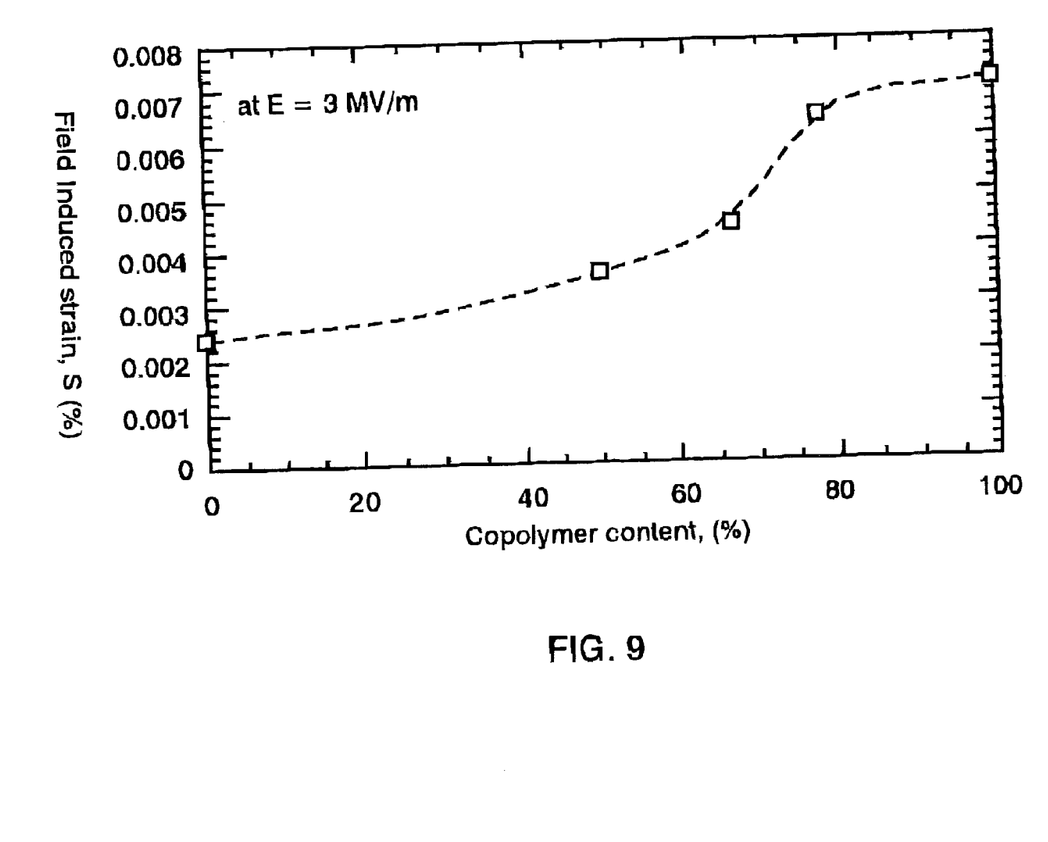
FIG. 9 is a graph showing the electric field-induced strain of the blends as a function of the copolymer content at an electric field strength of 3 MV/m.

FIG. 9 illustrates the variation in field-induced strain with copolymer content in the blend for a field strength of 3 MV/m. For this relatively low field strength, the piezoelectric response is dominant; therefore, the strain increases as the amount of the piezoelectric constituent increases. For the 75 wt. % copolymer blend, the strain is almost three times of that of the graft-elastomer and it is only about 8% lower than that of the copolymer. Considering the improved toughness of the blend as compared to the copolymer, and the enhanced strain and the mechanical modulus as compared to the graft-elastomer, the piezoelectric-electrostrictive polymer blend systems offer a way to optimize electromechanical properties for applications at lower field strength.

Figure 10A:
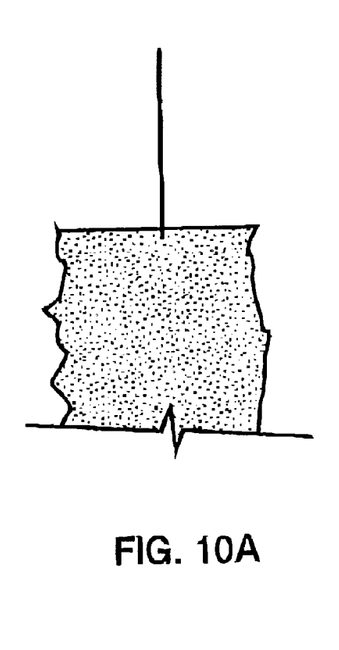
FIG. 10A is a bending actuator incorporating a copolymer-elastomer blend when no electric field is applied.
Figure 10B:
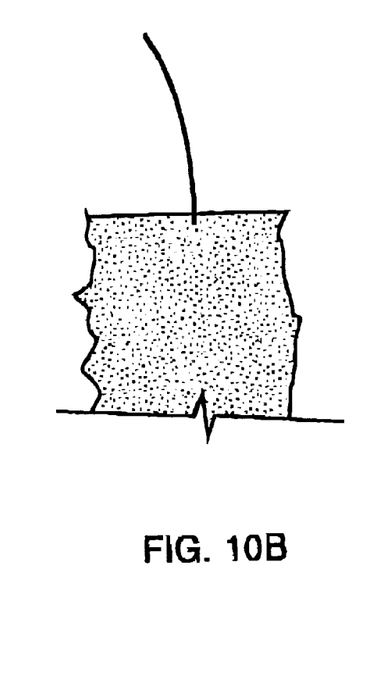
FIG. 10B is a bending actuator incorporating a copolymer-elastomer blend when an electric field of 90 MV/m is applied.

FIG. 10 depicts a prototype bending actuator fabricated using a film of the 50 wt. % composition of the copolymer-elastomer blend. The deflection of the bending actuator is determined by the applied electric field and the electric field induced strain of the blend. A deflection of approximately 4.5 mm was achieved with this actuator with the length of 22 mm. Larger deflections are achievable if the actuator is fabricated using the pure graft-elastomer; however, there is a trade-off between actuation force and deflection due to the relative moduli of the materials.

The copolymer-graft-elastomer blend system exhibited a marked improvement in toughness as compared to the copolymer. The blends also offer the potential of varying the composition of the materials constituents to tailor the properties for the desired applications. Due to the synergistic effect of the contributions of the remanent polarization and the mechanical stiffness, blends can be made to exhibit a higher piezoelectric strain and field-induced strain than the copolymer. As an example, the blend containing 75 wt. % copolymer exhibited a higher piezoelectric strain coefficient ($d_{31}$) and field induced strain (%) than the pure copolymer for some conditions. Furthermore, by adjusting the relative fraction of the two components in the blend, a temperature-independent piezoelectric strain response was achieved such as in the case of the 50 wt. % copolymer blend. The electric field induced strain in the copolymer-elastomer blend results from both piezoelectric and electrostrictive constituents. The piezoelectric contribution dominates when the electric field is low while the electrostrictive contribution becomes dominant at higher field strengths. The contributions of the two constituents are not independent. The presence of the copolymer in the blend appears to increase the barrier energy for the polar graft moieties to overcome in order to rotate (the mechanism for the electrostriction in the graft-elastomer).

It should be understood that the foregoing description and examples are only illustrative of the invention. Various alternatives and modifications can be devised by those skilled in the art without departing from the invention. Accordingly, the present invention is intended to embrace all such alternatives, modifications and variances that fall within the scope of the appended claims.

We claim:

1. A polymeric blend having dual actuating and sensing capabilities comprising:
   a sensing component selected from the group consisting of ferroelectric, piezoelectric, pyroelectric and photoelectric polymers; and
   an actuating component selected from the group consisting of electrostrictive graft elastomers, dielectric electroactive elastomers, liquid crystal electroactive elastomers and field responsive polymeric gels.

2. The polymeric blend of claim 1, wherein said sensing component and actuating component are co-processable and coexisting in a phase separated blend system.

3. The polymeric blend of claim 1, wherein said sensing component is a piezoelectric polymer.

4. The polymeric blend of claim 3, wherein said piezoelectric polymer is poly(vinylidene flouride-trifluoroethylene).

5. The polymeric blend of claim 1, wherein said actuating component is an electrostrictive graft elastomer.

6. The polymeric blend of claim 5, wherein said electrostrictive graft elastomer comprises a backbone molecule which is a non-crystallizable, flexible marcromolecular chain, and a grafted polymer forming polar graft moieties with backbone molecules, the polar graft having been rotated by an applied electric field.

7. The polymeric blend of claim 6, wherein the polar graft moieties have been rotated into substantial polar alignment.

8. The polymeric blend of claim 6, wherein the backbone molecule is a member selected from the group consisting of silicones, polyurethanes, polysulfides, nitrile rubbers, polybutenes, and fluorinated elastomers.

9. The polymeric blend of claim 8, wherein the backbone molecule is a chlorotrifluoroethylene-vinylidene fluoride copolymer.

10. The polymeric blend of claim 6, wherein the grafted polymer is a homopolymer or a copolymer, and the polar graft moieties are polar crystal phases and physical entanglement sites with backbone molecules.

11. The polymeric blend of claim 10, wherein the grafted polymer is a member selected from the group consisting of poly(vinylidene fluoride) and poly(vinylidene fluoride-trifluoroethylene) copolymers.

12. The polymeric blend of claim 6, wherein the backbone molecule is a chlorortrifluoroethylene-vinylidene fluoride copolymer, the grafted polymer is a member selected from the group consisting of poly(vinylidene fluoride) and poly (vinylidene fluoride-trifluoroethylene) copolymers, and the polar graft moieties are polar crystal phases and physical entanglement sites with backbone molecules, which polar graft moieties have been rotated by an applied electric field.

13. The polymeric blend of claim 12, wherein the polar graft moieties have been rotated into substantial polar alignment.

14. The polymeric blend of claim 1, wherein said sensing component comprises from about 1 to about 99 weight percent, based on the total weight of the blend and said actuating component comprises from about 99 to about 1 weight percent, based on the total weight of the blend.

15. The polymeric blend of claim 14, wherein said sensing component comprises 25% and said actuating component comprises 75%.

16. The polymeric blend is claim 14, wherein said sensing component comprises 50% and said actuating component comprises 50%.

17. The polymeric blend is claim 14, wherein said sensing component comprises 75% and said actuating component comprises 25%.

18. A bending actuator device made from the polymeric blend of claim 1.

19. A microelectromechanical device made from the polymeric blend of claim 1.

20. A method of making a polymeric blend having dual actuating and sensing capabilities comprising:
   combining a sensing component selected from the group consisting of ferroelectric, piezoelectric, pyroelectric and photoelectric polymers, and an actuating component selected from the group consisting of electrostrictive graft elastomers, dielectric electroactive elastomers, liquid crystal electroactive elastomers and field responsive polymeric gels.

21. The method of claim 20, wherein said sensing component and actuating component are added to N,N-dimethylformamide.

* * * * *

UNITED STATES PATENT AND TRADEMARK OFFICE
CERTIFICATE OF CORRECTION

PATENT NO. : 6,689,288 B2
DATED : February 10, 2004
INVENTOR(S) : Ji Su et al.

It is certified that error appears in the above-identified patent and that said Letters Patent is hereby corrected as shown below:

<u>Title page,</u>
Item [75], Inventors, replace "Terry L. St. Clair, Mechanicsville, VA (US); Joycelyn S. Harrison, Hampton, VA (US); Ji Su, Yorktown, VA (US); Zoubeida Ounaies; Norfolk, VA (US)" with -- Ji Su, Yorktown, VA (US); Joycelyn S. Harrison, Hampton, VA (US); Terry L. St. Clair, Mechanicsville, VA (US); Zoubeida Ounaies; Norfolk, VA (US) --

Signed and Sealed this

Thirteenth Day of July, 2004

JON W. DUDAS
*Acting Director of the United States Patent and Trademark Office*